(12) United States Patent
Mickan et al.

(10) Patent No.: US 7,136,149 B2
(45) Date of Patent: Nov. 14, 2006

(54) LITHOGRAPHIC APPARATUS WITH AUTOFOCUS SYSTEM

(75) Inventors: Uwe Mickan, Veldhoven (NL); Antonius Johannes Josephus Van Dijsseldonk, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 14 days.

(21) Appl. No.: 11/015,727

(22) Filed: Dec. 20, 2004

(65) Prior Publication Data

US 2006/0132743 A1    Jun. 22, 2006

(51) Int. Cl.
*G03B 27/52* (2006.01)
*G03B 27/68* (2006.01)
*G03B 27/42* (2006.01)

(52) U.S. Cl. .............................. 355/55; 355/52; 355/53

(58) Field of Classification Search ............ 355/52–55, 355/67; 356/399–401; 250/548
See application file for complete search history.

(56) References Cited

U.S. PATENT DOCUMENTS

| | | | | |
|---|---|---|---|---|
| 5,008,705 A | * | 4/1991 | Sindledecker | 355/43 |
| 5,489,966 A | * | 2/1996 | Kawashima et al. | 355/43 |
| 5,659,384 A | * | 8/1997 | Ina | 355/53 |
| 6,353,470 B1 | * | 3/2002 | Dinger | 355/71 |

\* cited by examiner

*Primary Examiner*—Henry Hung Nguyen
(74) *Attorney, Agent, or Firm*—Pillsbury Winthrop Shaw Pittman, LLP

(57) ABSTRACT

A lithographic apparatus having a projection system that includes a plurality of mirrors arranged to project the patterned radiation beam onto a target portion of the substrate. The lithographic apparatus further includes an autofocus system having a light source, a position sensitive detector, and a light directing arrangement for directing a first portion of light from the light source to the position sensitive detector. The light directing arrangement further directs a second portion of light from the light source into the projection system and, after the second portion of light has traveled through the projection system to the substrate and back through the projection system to the light directing arrangement, the second portion of light is directed onto the position sensitive detector.

20 Claims, 3 Drawing Sheets

LITHOGRAPHIC APPARATUS WITH AUTOFOCUS SYSTEM

FIELD OF THE INVENTION

The present invention relates to a lithographic apparatus having an autofocus system, and a method of focusing a beam of radiation on a substrate in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

The invention provides a lithographic apparatus including an illumination system for providing a radiation beam, a patterning device for imparting the radiation beam with a pattern in its cross-section to form a patterned radiation beam, a substrate table constructed to hold a substrate, and a projection system comprising a plurality of mirrors arranged to project the patterned radiation beam onto a target portion of the substrate.

The lithographic apparatus further includes an autofocus system having a light source, a position sensitive detector, and a light directing arrangement for coupling a first portion of light from the light source into the projection system, for directing a second portion of light from the light source to the position sensitive detector, and for directing the first portion of light to the position sensitive detector after it has traveled through the projection system to the substrate and back through the projection system to the light directing arrangement.

The radiation beam may be a beam of EUV radiation. In one embodiment, the projection system may be a six mirror system. The light directing arrangement may include a first prism which directs the first portion of light from the light source to the projection system, and which directs the second portion of light from the light source to the position sensitive detector.

The light directing arrangement may further include a second prism which couples the first portion of light from the light source into the projection system after the first portion of light has been directed by the first prism.

In one embodiment, the second prism directs the first portion of light to the first prism after it has traveled through the projection system to the substrate and back through the projection system to the second prism.

The first prism may direct the first portion of light, received from the second prism, to the position sensitive detector.

In one embodiment, the light from the light source may be visible white light. The first portion of light from the light source may follow the same path through the projection system as the radiation beam produced by the illumination system. A diaphragm having a plurality of apertures may be placed in the path of the light from the light source. The diaphragm may be provided with four apertures arranged to form four spots in a pupil plane. The position sensitive detector may comprise a photocell array. The autofocus system may be arranged so that a focus shift at the substrate results in a lateral shift in the position of the light at the position sensitive detector. The light from the light source may be modulated using two gratings having different pitches. The lithographic apparatus may further include an object lens positioned before the position sensitive detector.

The invention also provides a method of focusing a beam of radiation on a substrate in a lithographic apparatus which includes an illumination system for providing the radiation beam, a patterning device for imparting the radiation beam with a pattern in its cross-section to form a patterned radiation beam, a substrate table constructed to hold the substrate, and a projection system comprising a plurality of mirrors arranged to project the patterned radiation beam onto a target portion of the substrate.

The method includes providing a beam of light using a light source, providing a position sensitive detector, coupling a first portion of light from the light source into the projection system, directing a second portion of light from the light source to the position sensitive detector, and directing the first portion of light to the position sensitive detector after it has traveled through the projection system to the substrate and back through the projection system, and focusing the beam of radiation on the substrate based on information from the position sensitive detector.

The method may also make use of any of the optional features of the lithographic apparatus mentioned above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
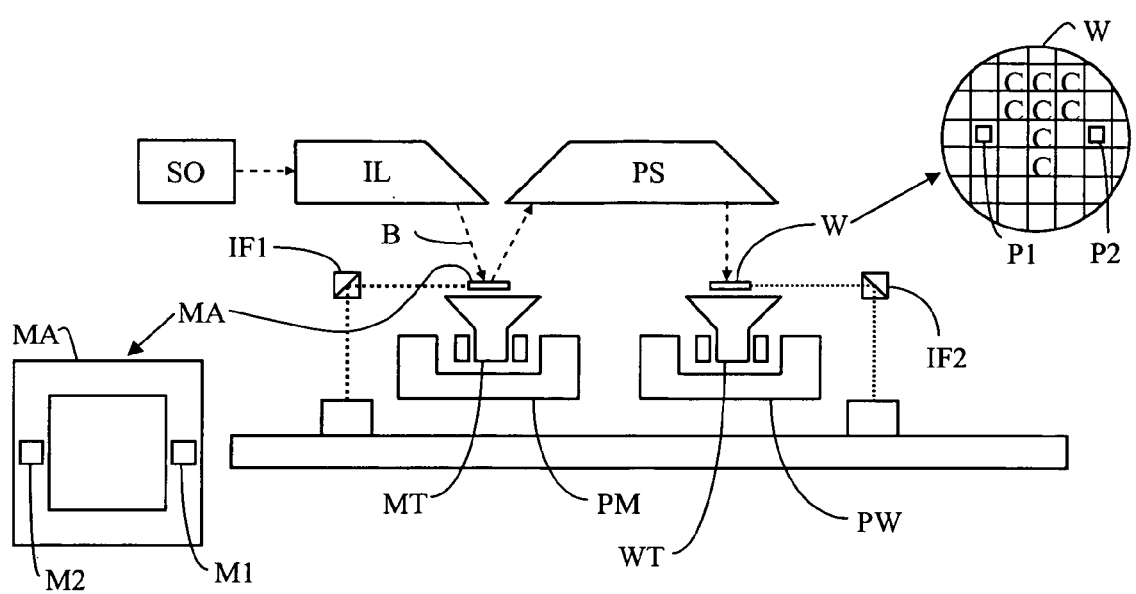
FIG. 1 depicts a lithographic apparatus suitable for use with an autofocus system in accordance with the invention.

FIG. 1 schematically depicts a lithographic apparatus suitable for use with an autofocus system in accordance with the invention. The apparatus includes:

- an illumination system (illuminator) IL configured to condition a radiation beam B (e.g. UV radiation or EUV radiation),
- a support structure (e.g. a mask table) MT constructed to support a patterning device (e.g. a mask) MA and connected to a first positioner PM configured to accurately position the patterning device in accordance with certain parameters,
- a substrate table (e.g. a wafer table) WT constructed to hold a substrate (e.g. a resist-coated wafer) W and connected to a second positioner PW configured to accurately position the substrate in accordance with certain parameters, and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example, when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
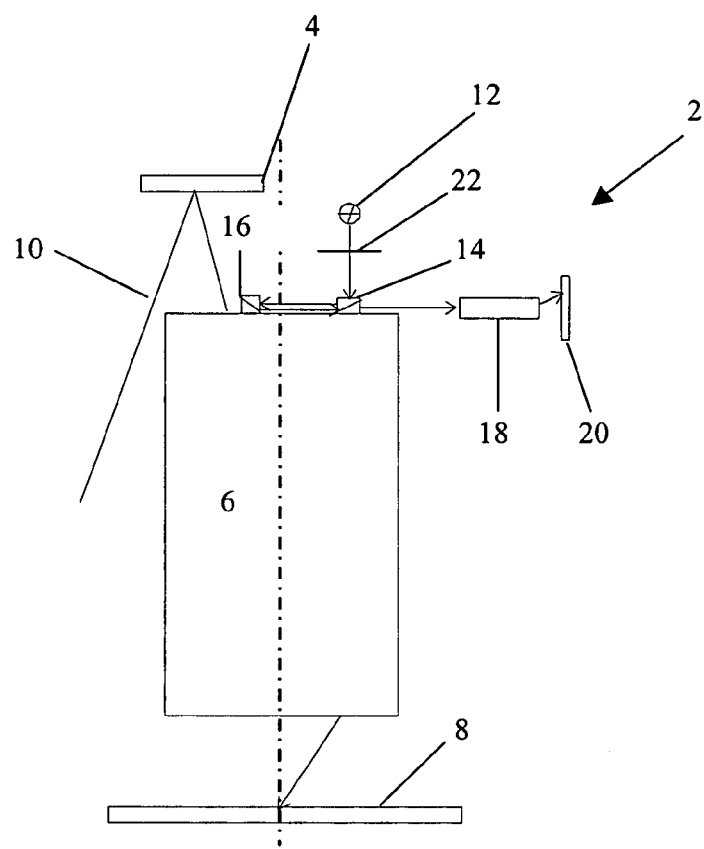
FIG. 2 shows a lithographic apparatus in accordance with an embodiment of the invention.

FIG. 2 shows part of a lithographic apparatus 2 that includes a reticle 4 and a projection optics box (POB) 6. The POB 6 contains a number of mirrors (not shown) which direct radiation from the reticle 4 onto a wafer 8. In one embodiment of the invention, the POB 6 may contain, for example, six (6) focusing mirrors (not shown) for focusing radiation onto the wafer 8.

In another embodiment of the invention, EUV (extreme ultra violet) radiation 10 may be directed onto the reticle 4 from an illumination source (not shown). The boundaries of EUV radiation are not precisely defined, but the EM spectrum resides at the high frequency end of UV (e.g. around 5 to 20 nm), just before X-rays.

The EUV radiation 10 may be reflected from the (reflective) reticle 4 before entering the POB 6, which focuses the EUV radiation onto the wafer 8. The advantage of using EUV radiation is that the very small wavelength allows improved resolution to be achieved, thereby allowing smaller lines to be printed on the wafer 8. Resolution is calculated by the formula k $\lambda$/NA, where k is a constant determined by the reticle, $\lambda$ is the wavelength of radiation used, and NA is the numerical aperture of the POB 6. In one embodiment, the EUV radiation used may have a wavelength of 13.5 nm. Since radiation at this wavelength may be absorbed by all known lenses, the POB 6 may use mirrors instead of lenses.

Using the small wavelength EUV radiation also allows a better (i.e. smaller) depth of field to be achieved at the wafer 8.

The embodiment illustrated in FIG. 2 also includes an autofocus system having a light source 12, first and second prisms 14 and 16, an object lens 18 and a position sensitive detector (PSD) 20.

The autofocus system may use the mirror optics of the EUV system. In one embodiment of the invention, the light from light source 12 may be coupled in and out of the mirror optics by the prisms 14 and 16 located on the top portion of the POB 6. In another embodiment of the invention, the light from the light source comprises visible white light. Light from light source 12 may be directed by prism 14 to prism 16, which directs the light into the POB 6 where it follows the same path from mirror to mirror as the EUV radiation 10.

The light may go through the POB 6 to the wafer 8, where it is reflected and goes back along the same path through the POB 6. The light may be directed by the prism 16 to the prism 14, and may be directed by the prism 14 to the object lens 18, which focuses the light onto the position sensitive detector 20.

Figure 3:
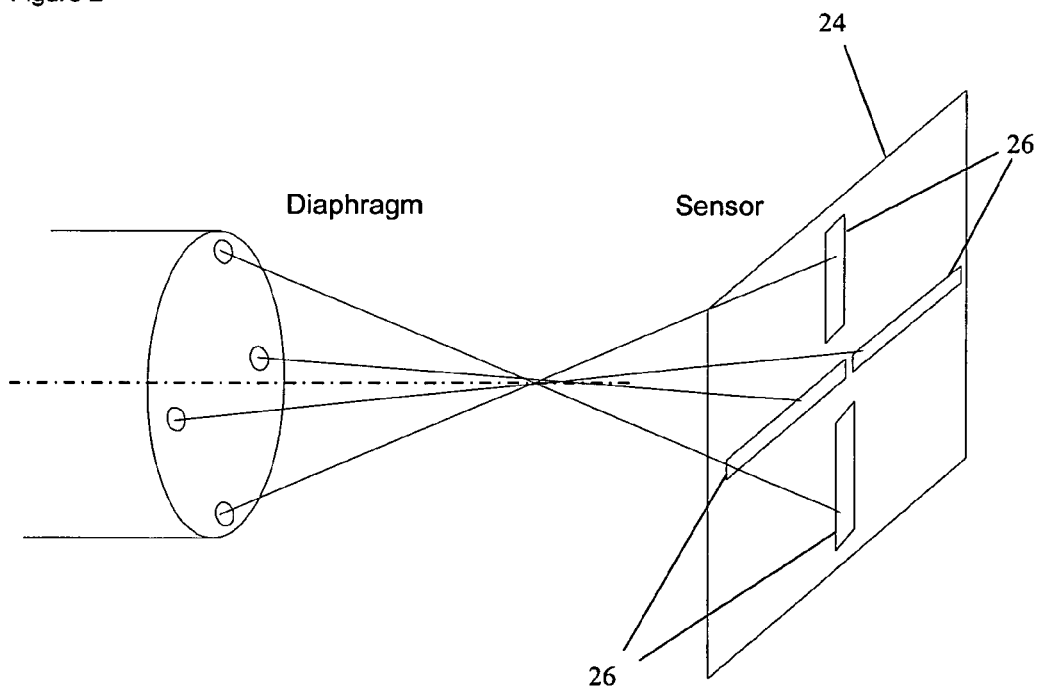
FIG. 3 shows the diaphragm and sensor plane of the embodiment of FIG. 2.

A diaphragm 22 may be positioned between the light source 12 and the first prism 14. The diaphragm 22 may form four spots in the pupil plane, as shown in FIG. 3. The detector/sensor 20 may be located in a near pupil plane (i.e. sensor plane 24), and may be provided with four detection diodes 26. The system may be arranged so that a focus shift at the wafer 8 may result in a lateral shift (i.e. sideways movement) of the light at the PSD 20. The PSD 20, which may comprise a photocell array, or another linear system can therefore be used to detect the focus shift. In FIG. 2, only one 'focus spot' is sketched. However, any number of focus spots may be used. Also, the light coupled into the POB 6 may include the same angles as would come from the reticle 4.

Conventional systems used a focus system mounted beyond the POB 6, and the use of the present autofocus system provides a benefit that such a focus system no longer causes design restrictions. Using such a focus system to perform wafer maps for higher accuracy, without impacting throughput, is no longer as imperative.

Figure 5:
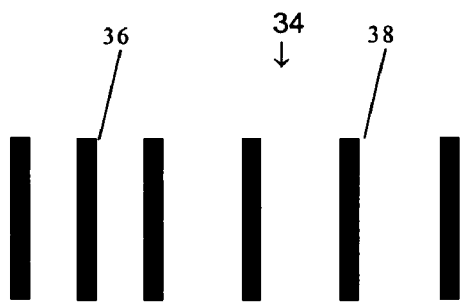
FIG. 5 illustrates an exemplary grating which is used in the light source in FIG. 2.

In one exemplary embodiment of the invention, the light may be modulated using two gratings containing different pitches, such as a narrow pitch grating 36 and a wider pitch grating 38, as, schematically represented in FIG. 5. FIG. 5 shows an example of a grating 34, which is part of the light source 12. The gratings may be projected both to the sensor 20 directly and to the wafer 8, where the image may be back reflected to the sensor 20. At the sensor 20, the difference in image position provides the focus information. The two pitches help to identify the direction and unequivocally the zero point. If only one pitch is used, a reference point is not present. When two different pitches are used, this problem is overcome. In an alternative embodiment of the invention, more than two pitches may also be used.

In an alternative embodiment of the invention, the invention may be combined to measure the reticle height directly to the slit. Currently, only left and right shifts with respect to the slit are measurable. The reticle height may be measured by applying the described method to measure the focus of the wafer. In other words, the installation offers, in addition, the possibility to measure the reticle to projection optics or to the so-called best object plane. Furthermore the installation may be enlarged with a line of sight sensor (to detect the optic induced x-shift) and a wavefront sensor (doubling the sensitivity by going twice through the system).

The invention is not only limited to EUV systems. The invention may be adapted to an immersion system where the focus then can be measured directly through the immersion liquid. The invention can also be used with maskless systems.

Figure 4:
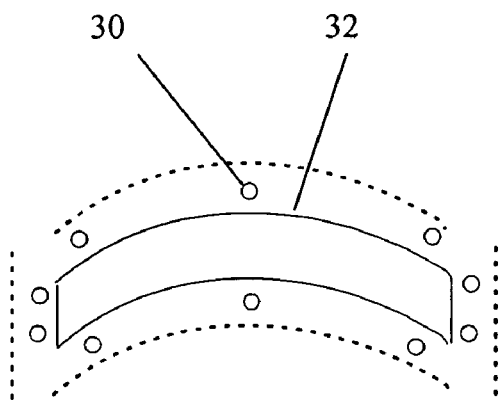
FIG. 4 shows possible spot positions around the illumination slit.

FIG. 4 shows possible spot positions 30 around the illumination slit 32.

In the example, the slit size is not limited to 8 mm and 104 mm at the reticle 4. 0.5 mm up to 1 mm are possible with more on astigmatism. (The field (object field) which is used for printing structures is limited to (i.e. must be smaller than) a maximum field size. Outside the used field focus sensor works well but some additional images may need to be taken into account.) Focus shift is also dependent on the position, working as offset to the center point. (That is, the field (slit) has a center and the focus sensor is not necessary located close to the center.)

Figure 6:
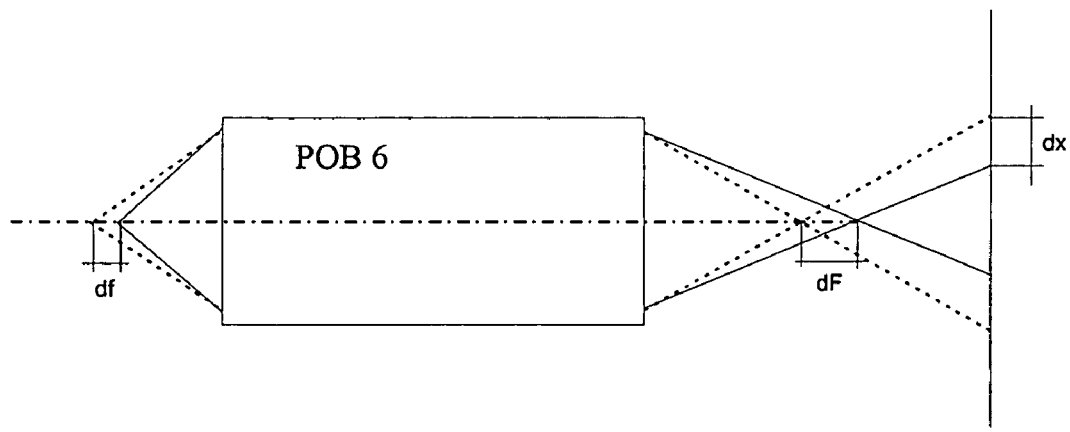
FIG. 6 illustrates the calculation of sensitivity estimations for the embodiment of FIG. 2.

The following is a sensitivity estimation based on FIG. 6.

$$dF = df \cdot Mag^2$$ Equation 1
$$dx = dF \cdot \frac{NA}{Mag}$$
$$dx = df \cdot Mag \cdot NA$$
$$dx = df$$

In an exemplary embodiment, magnification may be fixed at 4 and the NA may be at a maximum of 0.25.

For the minimum value of NA=0.15, dx may be calculated to be dx=0.6 df.

The sensitivity is now given by the change in covered surface on the detector diode of the PSD 20 due to focus shift of both images (due to the two different pitches) on the detector.

We next consider an example calculation in which the following are assumed:

number of lines 100 size of a line 0.5 μm in width and 20 μm long focus shift 10 nm

Then the surface of the grating at focus is 1000 μm². The focus shift may lead to a change in covered surface by 20 μm (because the centre of gravity of the image is shifted). That is a ratio of 1/50 or 2%.

The example shows further that the detectable focus shift is linked to the line width of the grating with limitations on the focus range. Therefore different gratings are required to cover the whole focus range.

The required measurement range is less than 1 mm. The range where a high accuracy is necessary is below 100 μm. The required accuracy should be in the order of 10 nm, which gives a ratio of $10^3$ between range and the accuracy.

The object lens 18 shown in FIG. 2 may be used, depending on the properties of the PSD 20 (e.g. with a magnification of 100). Any lens may introduce chromatic errors seen as an unexpected focus shift on the PSD 20. (Note: The POB 6 itself also contributes to the chromatic error.) A calibration routine may be used to eliminate the chromatic effects. A two or three color correction procedure may be used by adapting a color filter after the light source. The focus range may be observed for any of the different colors.

The spot size depends on the averaging of the wafer size and the other side on the PSD 20 properties.

As principle limit the light (photon) sensitivities of the PSD 20 may be considered.

Keeping in mind that the resulting dark current (due to the physical limit of any diode, which gives a signal also in the case of no-light.) is a result of the light outside the spot coming form unexpected reflections etc.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus having an illumination system for providing a radiation beam, a patterning device for imparting the radiation beam with a pattern in its cross-section to form a patterned radiation beam, and a substrate table constructed to hold a substrate, the lithographic apparatus comprising:
    a projection system having a plurality of mirrors arranged to project the patterned radiation beam onto a target portion of the substrate, the projection system having a first side that receives the pattern radiation beam and a second side that projects the patterned radiation bean onto the target portion of the substrate; and
    an autofocus system that is located on the first side of the projection system, comprising:
        a light source;
        a position sensitive detector; and
        a light directing arrangement for coupling a first portion of light from the light source into the projection system, for directing a second portion of light from the light source to the position sensitive detector, and for directing the first portion of light to the position sensitive detector after the first portion of light has traveled through the projection system to the substrate and back through the projection system to the light directing arrangement.

2. The lithographic apparatus as claimed in claim 1, wherein the patterned radiation beam is a beam of EUV radiation.

3. The lithographic apparatus as claimed in claim 1, wherein the projection system comprises a six mirror system.

4. The lithographic apparatus as claimed in claim 1, wherein said light directing arrangement comprises a first prism that directs the first portion of light from the light source to the projection system, and which directs the second portion of light from the light source to the position sensitive detector.

5. The lithographic apparatus as claimed in claim 4, wherein the light directing arrangement further comprises a second prism that optically couples the first portion of light originating from the light source into the projection system after the first portion of light has been directed by the first prism.

6. The lithographic apparatus as claimed in claim 5, wherein the second prism directs the first portion of light to the first prism after it has traveled through the projection system to the substrate and back through the projection system to the second prism.

7. The lithographic apparatus as claimed in claim 6, wherein the first prism directs the first portion of light, received from the second prism, to the position sensitive detector.

8. The lithographic apparatus as claimed in claim 1, wherein the light from the light source comprises visible white light.

9. The lithographic apparatus as claimed in claim 1, wherein the first portion of light from the light source follows a same path through the projection system as the radiation beam produced by the illumination system.

10. The lithographic apparatus as claimed in claim 1, wherein a diaphragm having a plurality of apertures is placed in a path of the light originating from the light source.

11. The lithographic apparatus as claimed in claim 10, wherein the diaphragm is provided with four apertures arranged to form four spots in a pupil plane.

12. The lithographic apparatus as claimed in claim 1, wherein the position sensitive detector comprises a photocell array.

13. The lithographic apparatus as claimed in claim 1, wherein the autofocus system is arranged so that a focus shift at the substrate results in a lateral shift in a position of the light at the position sensitive detector.

14. The lithographic apparatus as claimed in claim 1, wherein the light originating from the light source is modulated using two gratings having different pitches.

15. The lithographic apparatus as claimed in claim 1, further comprising an object lens positioned before the position sensitive detector.

16. A method of focusing a beam of radiation onto a substrate in a lithographic apparatus that includes an illumination system for providing the radiation beam, a patterning device for imparting the radiation beam with a pattern in its cross-section to form a patterned radiation beam, a substrate table constructed to hold the substrate, and a projection system having a plurality of mirrors arranged to project the patterned radiation beam onto a target portion of the substrate, the method comprising:
    providing a beam of light;
    providing a position sensitive detector that receives one or more portions of the beam of light;
    directing a first portion of the beam of light from the light source to the projection system, to enable the first portion of light to travel through the projection system to the substrate and back through the projection system before being projected onto the position sensitive detector;
    directing a second portion of the beam of light from the light source to the position sensitive detector; and
    adjusting a focus for the beam of radiation on the substrate based on information derived from the position sensitive detector.

17. The method according to claim 16, wherein the first portion of light from the light source follows a same path through the projection system as the radiation beam produced by the illumination system.

18. The method according to claim 16, further comprising modulating the light originating from the light source using two gratings having different pitches.

19. The method according to claim 16, wherein adjusting the focus produces a lateral shift in a position of the light at the position sensitive detector.

20. A lithographic apparatus having an illumination system for providing a radiation beam, a patterning device for imparting the radiation beam with a pattern in its cross-section to form a patterned radiation beam, and a substrate table constructed to hold a substrate, the lithographic apparatus comprising:
    a projection system having a plurality of mirrors arranged to project the patterned radiation beam onto a target portion of the substrate, the projection system having a first side that receives the pattern radiation beam and a second side that projects the patterned radiation beam onto the target portion of the substrate; and an autofocus system that is located on the first side of the projection system, comprising:
  a light source;
  a first optical device;
  a second optical device; and
  a position sensitive detector;
  wherein the first optical device and the second optical device are arranged to direct a first portion of light from the light source into the projection system and for directing the first portion of light to the position sensitive detector after the first portion of light has traveled through the projection system to the substrate and back through the projection system, and wherein the first optical device is arranged to direct a second portion of light from the light source to the position sensitive detector.

* * * * *